(12) United States Patent  (10) Patent No.: US 7,479,635 B2
Ichikawa  (45) Date of Patent: Jan. 20, 2009

(54) INFRARED DETECTOR PACKAGE

(75) Inventor: Kozo Ichikawa, Yokohama (JP)

(73) Assignee: Showa Optronics Co., Ltd., Tokyo (JP)

( * ) Notice: Subject to any disclaimer, the term of this patent is extended or adjusted under 35 U.S.C. 154(b) by 0 days.

(21) Appl. No.: 11/802,950

(22) Filed: May 29, 2007

(65) Prior Publication Data

US 2008/0179524 A1 Jul. 31, 2008

(30) Foreign Application Priority Data

Jan. 25, 2007 (JP) ............................. 2007-014886

(51) Int. Cl.
    *G01J 5/04* (2006.01)
(52) U.S. Cl. .................................. 250/338.1
(58) Field of Classification Search .............. 228/124.6, 228/121; 250/338.1
    See application file for complete search history.

(56) References Cited

U.S. PATENT DOCUMENTS 4,769,272 A * 9/1988 Byrne et al. ................ 428/209
2006/0115323 A1* 6/2006 Coppeta et al. ............. 403/270

FOREIGN PATENT DOCUMENTS

JP 2003139616 A 5/2003

* cited by examiner

*Primary Examiner*—Constantine Hannaher
(74) *Attorney, Agent, or Firm*—Pearl Cohen Zedek Latzer LLP

(57) ABSTRACT

In an infrared detector package, a first annular metallized layer (6a, 6b) is formed along the annular shoulder (4a) of a casing member (4), and a second annular metallized layer (7) is formed along the annular mating surface of a window member (5). Brazing material (8) is integrally interposed between the first and second metallized layers. At least one of the first and second annular metallized layers comprises a mutually separated concentric portions (6a, 6b), and the brazing material extends across the two mutually separated concentric portions. During the manufacturing process, brazing material is deposited on one of the two mutually separated concentric portions, and is allowed to flow along the opposing metallized surface until the brazing material reaches the other of the two mutually separated concentric portions. Because the brazing material exposes a clean metallic surface as it flows so that the brazing material is properly interposed between the opposing annular metallized layer and the other of the mutually separated concentric portions of the corresponding annular metallized layer without any intervention of dross, oxidized film or other foreign matters. Thereby the brazing material ensures a favorable bonding and sealing performance.

8 Claims, 9 Drawing Sheets

INFRARED DETECTOR PACKAGE

CROSS-REFERENCE TO RELATED APPLICATIONS

This application claims priority from Japanese application 2007-14886, filed on Jan. 25, 2007, incorporated by reference herein in its entirety.

TECHNICAL FIELD

The present invention relates to an infrared detector package that includes an infrared detecting device and a casing enclosing the infrared detecting device in a vacuum environment, and in particular to an arrangement for achieving an air tight seal between a casing main body and a window member that permits transmission of infrared radiation.

BACKGROUND OF THE INVENTION

An infrared detector detects the intensity of infrared radiation by measuring a change in the temperature of an infrared detecting device upon which the infrared radiation impinges. To prevent the radiation energy captured by the device from dissipating to outside, the device is kept in a vacuum environment. To produce such an infrared detector, it is known to place a device in a recess of a casing main body and secure a window member onto an opening of the recess by brazing in a vacuum chamber (see Japanese patent laid open publication No. 2003-139616). Brazing material is deposited on a part of the casing main body surrounding the opening, and the casing main body and window member are heated by corresponding heaters provided in an upper and lower parts of the vacuum chamber to turn the brazing material into molten state. The two parts are then pushed against each other, and are allowed to cool off by turning off the heaters until the brazing material solidifies and securely joins the two parts.

In particular, the mentioned patent publication discloses the use of a flange having a metallized surface to ensure a mechanically strong and air tight bonding between the casing main body and window member. More specifically, a metallized layer formed on each of the bonding surfaces of the casing and the corresponding bonding surface of the window member, and is processed so as to have a favorable affinity with molten brazing material. The inner edge of the flange is chamfered. Thereby, a fillet of brazing material is formed along the inner edge of the flange to achieve a reliable bonding.

The method for making such a package typically includes the following steps. First of all, as illustrated in FIG. 10a, a ceramic casing 94 defining a cylindrical cavity 93 is prepared. An infrared detecting device 92 is mounted on the bottom of the cavity 93. A casing annular metallized layer 96 is formed on an annular shoulder surface defined along the part of the casing surrounding the opening of the cavity 93, and a prescribed amount of molten brazing material 98 such as In—Sn and Sn—Ag alloys having a melting point below 250° C. is deposited on the casing annular metallized layer 96 in a vacuum environment. The deposited brazing material 98 is allowed to cool and solidify. Because the metallized layer 96 has a high affinity with the molten brazing material 98, the molten brazing material 98 extends over the entire surface of the metallized layer 96, and assumes a somewhat upwardly bulging shape owing to the surface tension thereof.

This assembly 91 is then taken out of the vacuum environment and the deposited brazing material 98 is suitable machined so as to remove excess part and reveal a clean metallic surface free from oxidized film as illustrated in FIG. 10b. This assembly 91 along with a corresponding window member 95 is then set in a vacuum chamber to perform a baking process. As shown in FIG. 10c, by using a suitable jig, the window member 95 is placed above the ceramic casing 94 and is pressed against the ceramic casing 94 while heating the assembly. Thereby, the brazing material 98 joins the window member 95 with the ceramic casing 94 in an air tight and mechanically secure manner.

However, according to such a conventional method for making an infrared detector package, the loss of the brazing material is significant owing to the need for shaping the brazing material by machining. Also, the metal surface revealed by the machining may not remain clean until the baking or brazing process, and the segregation, formation of dross and other forms of soiling of the metal surface that could cause improper brazing results may occur. It has been proposed to scrub the window member while the brazing material is in molten state, but it is difficult to eliminate the possibility of improper brazing or imperfect sealing. As a result, a significant amount of efforts were required to totally eliminate defects in the products, and the manufacturing cost was undesirably high.

BRIEF SUMMARY OF THE INVENTION

In view of such problems of the prior art, a primary object of the present invention is to provide an infrared detector package that can be made free from any sealing failure in a reliable manner.

A second object of the present invention is to provide an infrared detector package that can be made substantially without any material loss.

A third object of the present invention is to provide an infrared detector package that can be made with a highly simple process.

According to the present invention, these and other objects of the present invention can be accomplished by providing an infrared detector package, comprising: a casing member defining a cavity therein and provided with an annular shoulder disposed around an opening of the cavity; an infrared detector device received in the cavity; a window member provided with an annular mating surface corresponding to the annular shoulder and having a high infrared transmissivity; a first annular metallized layer formed along the annular shoulder of the casing member; a second annular metallized layer formed along the annular mating surface of the window member; and brazing material integrally interposed between the first and second metallized layers; wherein at least one of the first and second annular metallized layers comprises a mutually separated concentric portions, and the brazing material extends across the two mutually separated concentric portions.

Such an infrared detector package can be made by a method comprising the steps of: preparing a casing member defining a cavity therein and provided with an annular shoulder disposed around an opening of the cavity; mounting an infrared detector in the cavity; preparing an window member provided with an annular mating surface corresponding to the annular shoulder and having a high infrared transmissivity; forming a first annular metallized layer along the annular shoulder of the casing member; forming a second annular metallized layer along the annular mating surface of the window member, at least one of the first and second annular metallized layers comprising a mutually separated concentric portions; depositing molten brazing material on one of the mutually separated concentric portions and allowing the brazing material to solidify; placing the window member and casing member into a vacuum environment; heating the brazing material while pressing the window member against the casing member with the two members aligned with each other so as to coincide the first annular metallized layer with the second annular metallized layer; allowing the brazing material to solidify in the vacuum environment; and removing the completed infrared detector package out of the vacuum environment.

Thereby, when heated and placed under pressure, the brazing material is allowed to expose a clean metallic surface and flows along the opposing annular metallized layer so that the brazing material is properly interposed between the opposing annular metallized layer and the other of the mutually separated concentric portions of the corresponding annular metallized layer without any intervention of dross, oxidized film or other foreign matters. Thereby the brazing material ensures a favorable bonding and sealing performance.

The two mutually separated concentric portions can be realized by forming a pair of radially separated concentric annular metallized layers, by a pair of vertically separated concentric annular metallized layers or by separating a single annular metallized layer with a concentric band of material which has a low affinity with the brazing material. According to a preferred embodiment of the present invention, the two mutually separated concentric portions are formed on two mutually parallel portions of the corresponding mating surface that have different elevations.

According to a preferred embodiment of the present invention, one of the mutually separated concentric portions substantially entirely overlaps with the opposing annular metallized layer while the other of the mutually separated concentric portions substantially only partly overlaps with the opposing annular metallized layer, and the molten brazing material is deposited on the other of the mutually separated concentric portions. The one annular metallized layer performs the function of retaining the brazing material prior to the baking or brazing step, and the other annular metallized layer performs the function of forming a favorable bonding with the opposing metallized layer which is free from dross or other contaminations.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
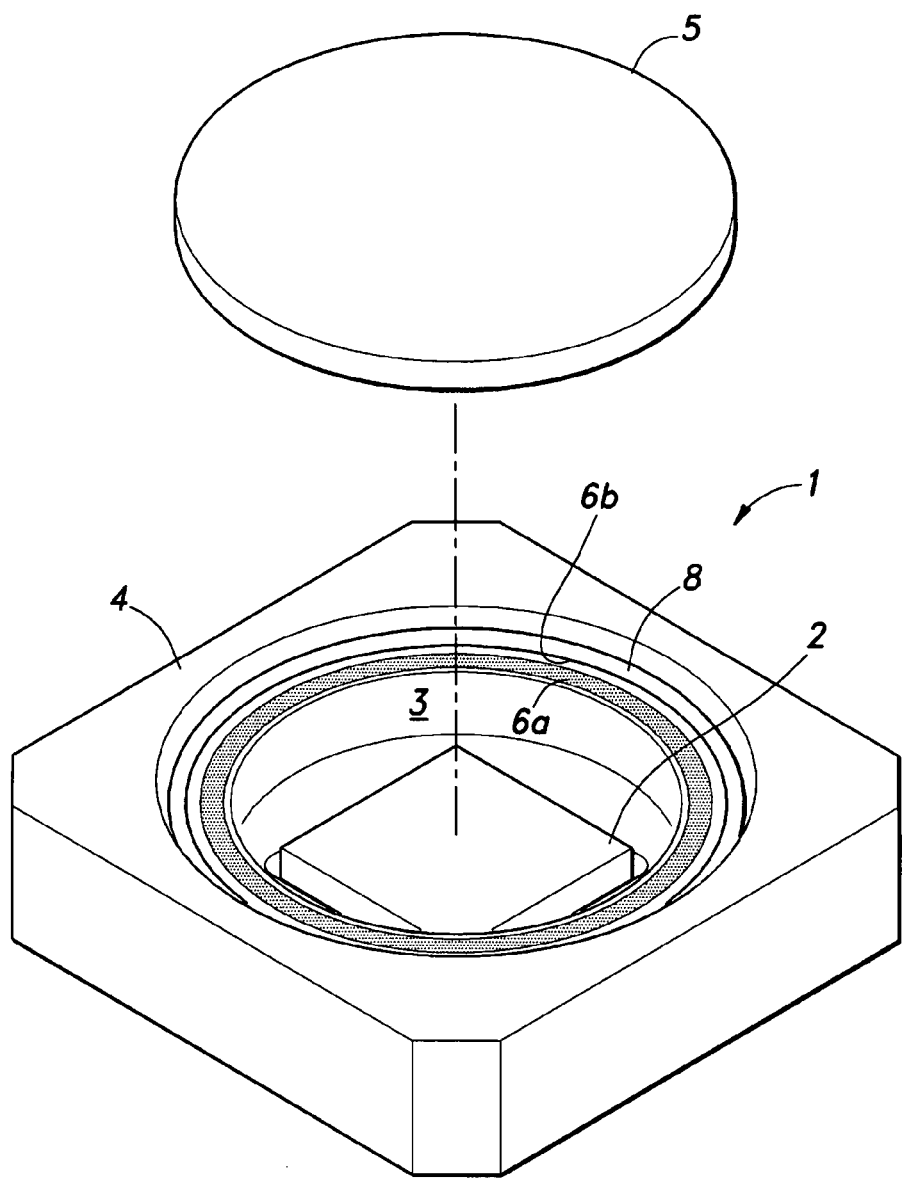
FIG. 1 is an exploded perspective view of an infrared detector package embodying the present invention.
Figure 2:
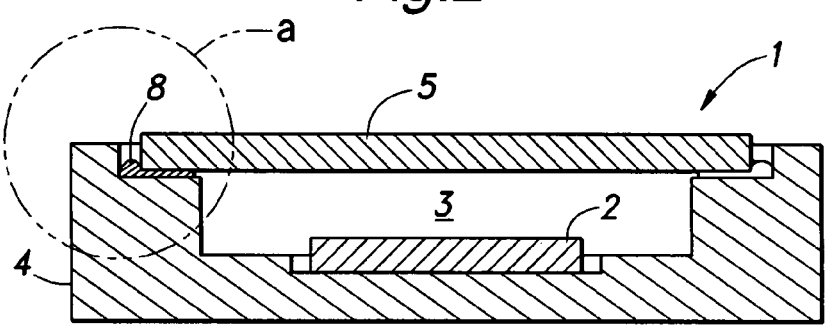
FIG. 2 is a vertical sectional view of the infrared detector package.
Figure 3:
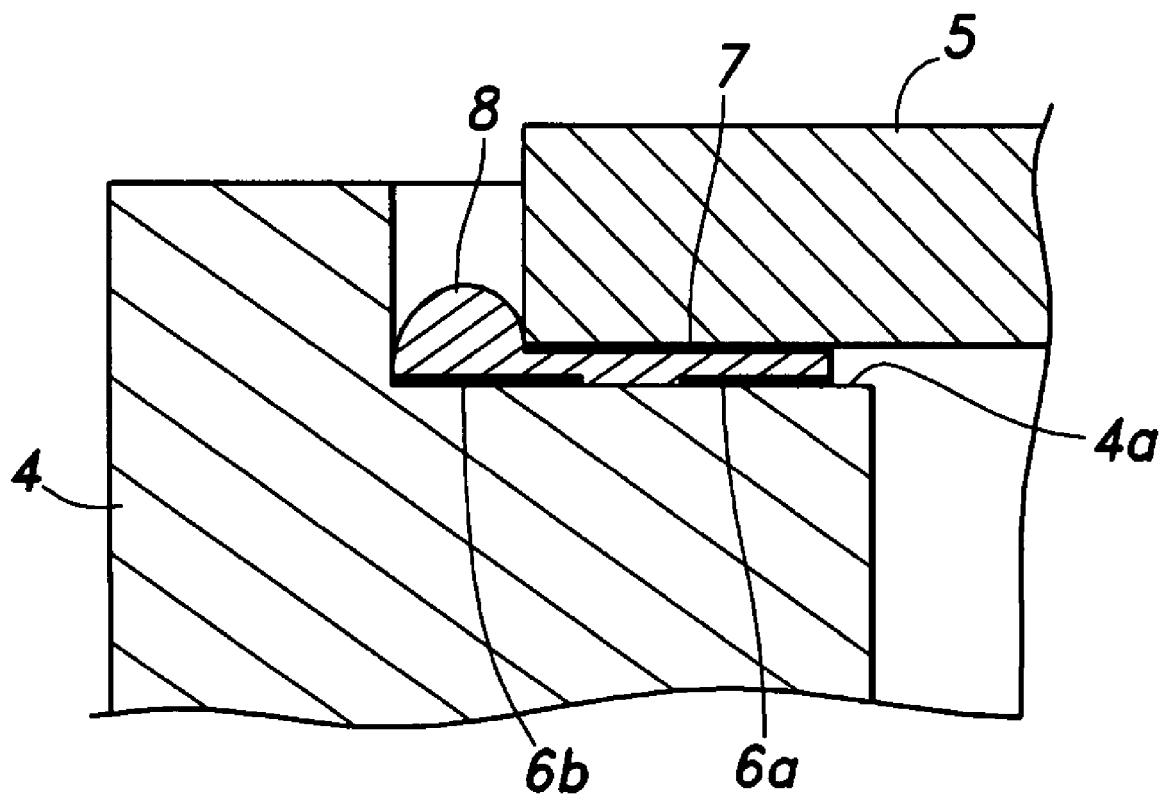
FIG. 3 is an enlarged fragmentary sectional view of a part of the infrared detector package indicated by a in FIG. 2.

Referring to FIGS. 1 to 3, an infrared detector 1 comprises an infrared 25 detecting device 2, a rectangular casing 4 defining a cylindrical cavity 3 therein and a window member 5 fitted on an open end of the cavity 3 in an air tight manner. The infrared detecting device 2 is mounted on the bottom surface of the cylindrical cavity 3.

The casing 4 is typically made of ceramic material. The window member 5 may be made of material such as germanium, silicon and sapphire that transmits infrared radiation. The device is electrically connected to a plurality of bonding pads (not shown in the drawings) provided in a bottom part of the cavity 3 by using bonding wire. To prevent infrared radiation energy from dissipating to outside, the cavity 3 is evacuated or placed in a state of vacuum.

As shown in FIGS. 2 and 3, a peripheral part of the window member 5 is bonded to a shoulder surface 4*a* formed in the part of the casing 4 surrounding the open end of the cavity 3 by brazing material 8. The brazing material may be selected from In—Sn and Sn—Ag alloys having a relatively low melting point, preferably lower than 250° C., but may also be selected from other available materials. The interface between the window member 5 and casing 4 is generally planar. The bonding surface on the window member 5 includes an annular metallized layer 7. The bonding surface of the casing 4 includes a pair of mutually concentric annular metallized layers 6*a* and 6*b*. The outer periphery of the shoulder surface 4*a* is surrounded by a vertical wall, but such a vertical wall may also be absent.

When the casing 4 is made of ceramic material, the metallized layers may comprise a conductive pattern made of sintered Mo, Mn or Ti and plated with metallic material having a favorable affinity with the brazing material 8 such as Ni, Ag and Au. When the casing is made of germanium, silicon, sapphire or glass, the metallized layers may comprise a conductive pattern made of a vapor deposited layer of Cr, Cu, Ni, Ag or Au having a thickness preferably in the range of 10 to 100 μm. However, for the purpose of the present invention, the metallized layers may consist of any material which is electrically conductive and has a relatively high affinity with molten brazing material. The width of each metallized layer may be in the range of 0.2 mm to 10 mm, and is 1.5 mm in the case of the illustrated embodiment. The gap between the two concentric annular metallized layers 6*a* and 6*b* is preferably greater than 0.1 mm (and substantially smaller than the width of the annular metallized layer 7 of the window member 5) to avoid a spillover of the molten brazing material, and is 0.5 mm in the case of the illustrated embodiment.

The inner diameter of the window annular metallized layer 7 is substantially identical to that of the casing inner annular metallized layer 6*a*. The outer diameter of the window annular metallized layer 7 is intermediate between the inner and outer diameters of the casing outer annular metallized layer 6*b*. Therefore, in the plan view, the casing inner annular metallized layer 6*a* entirely overlaps with the window annular metallized layer 7 while the casing outer annular metallized layer 6*b* only partly overlaps with the window annular metallized layer 7.

The brazing material 8 entirely covers the surfaces of the three annular metallized layers 6a, 6b and 7, and has a thickness in the range of 10 µm to several hundred µm. A part of the brazing material 8 forms a swell that protrudes into an annular gap defined between the outer edge of the window member 5 and the opposing inner peripheral wall of the shoulder surface 4a.

The process of making this infrared detector package is described in the following.

First of all, a pair of concentric, mutually spaced annular metallized layers 6a, 6b are formed on the shoulder surface (bonding surface) 4a of the ceramic casing 4 that mates with the corresponding bonding surface of the window member 5. As will be described in the following, the outer annular metallized layer 6b performs the function of confining the initially deposited molten brazing material 8 within a prescribed area while the inner annular metallized layer 6a performs the function of bonding the ceramic casing 4 and window member 5 together. At the same time, an annular metallized layer 7 is formed on the bonding surface of the window member 5.

Figure 4A:
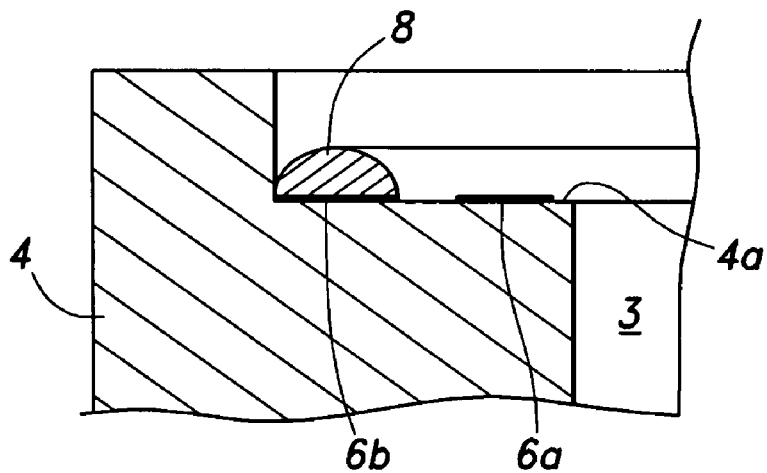
FIGS. 4*a* to 4*c* are views similar to FIG. 3 showing different steps of making the infrared detector package according to the present invention.

As illustrated in FIG. 4a, a prescribed amount of molten brazing material 8 is deposited on the casing outer metallized layer 6b over the entire circumference thereof. Because of the lack of affinity between the molten brazing material 8 and ceramic material of the casing 4, the molten brazing material 8 essentially stays on the casing outer metallized layer 6b and bulges upward under the surface tension thereof. In other words, the casing outer metallized layer 6b that has a high affinity with the molten brazing material dictates the expanse of the molten brazing material 8. According to the present invention, this step may be executed in the atmosphere as opposed to the prior art. The infrared detecting device 2 is already received in the ceramic casing 4 before the above described manufacturing process is started in the illustrated embodiment, but the steps of placing the infrared device 2 in position and/or connecting the device with bonding pads by using bonding wire may also be executed between the steps of forming the annular layers and depositing the brazing material or after the step of depositing the brazing material.

Figure 4B:
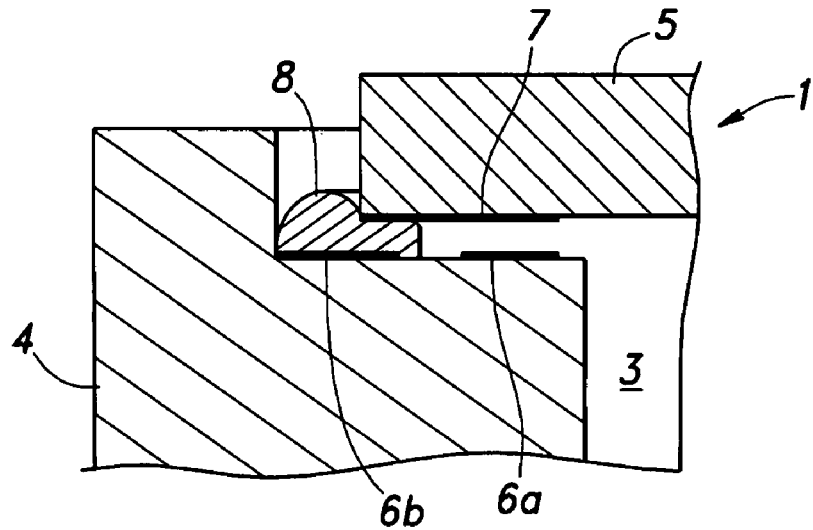
Figure 4C:
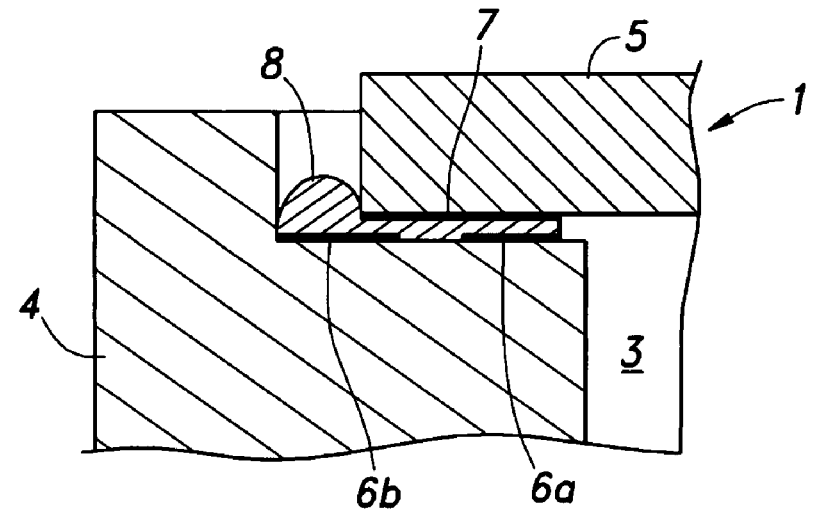

The deposited brazing material 8 is allowed to solidify and the window member 5 is placed on the shoulder surface 4a of the casing 4 as illustrated in FIG. 4b. The assembly is then placed in a vacuum chamber and is heated while the window member 5 is centered with respect to the casing 4 and pushed against the casing 4 by using a suitable jig and manipulator not shown in the drawings. As a result, the brazing material 8 partly liquefies and this breaks an oxidized surface skin of the brazing material so as to expose a new metal surface. Dross that forms on the molten surface of the brazing material remains relatively immobile because of its low fluidity while the molten metal relatively freely flows along the surface of the window metallized layer 7 until it reaches the inner edge of the casing inner metallized layer 6a because of a high fluidity of the molten brazing material and a high affinity between the molten brazing material and window annular metallized layer 7. In other words, guided by the window annular metallized layer 7, the molten brazing material 8 not only covers both the inner and outer window annular layers 6a and 6b but also bridges across the two annular metallized layers 6a and 6b. At the same time, the window annular metallized layer 7 is entirely covered by the brazing material and joined to the casing annular layers 6a and 6b as illustrated in FIG. 4c. The excess brazing material forms a bulge that extends upward into a gap between the outer periphery of the window member 5 and the surrounding vertical wall of the shoulder surface 4a.

Thereafter, the assembly is allowed to solidify in vacuum, and this causes the casing and window members 4 and 5 to be not only joined to together but also the cavity 3 to be hermetically sealed off from the exterior. Thereby, the infrared detecting device 2 is placed in a vacuum environment formed in the cavity 3 of the casing 4.

Because the brazing material was initially confined to the casing outer annular metallized layer 6a, a significant displacement of the brazing material occurs during the baking process, and this ensures the exposure of a fresh metal surface of the brazing material and a reliable bonding result. If the casing annular metallized layer consisted of a single annular metallized layer, instead of two mutually concentric annular metallized layers, the initially deposited layer would be deposited over the entire surface of the single annular metallized layer so that there would be a relatively small displacement of the brazing material during the subsequent baking process, and the bonding result would be substantially poorer owing to the intervention of dross, oxides and other inclusions in the bonding surfaces. Because the presence of an oxidized layer on the initially deposited brazing material would not prevent a favorable brazing process according to the present invention, the step of initially deposing the brazing material onto the annular metallized layer on the shoulder surface of the casing may be carried out in the atmospheric environment instead of in a vacuum environment so that the manufacturing process can be simplified. Also, there is no need for machining, scrubbing or other additional steps. In short, according to the disclosed embodiment, only the baking process is required to be carried out in an inert environment such as a vacuum environment.

Figure 5A:
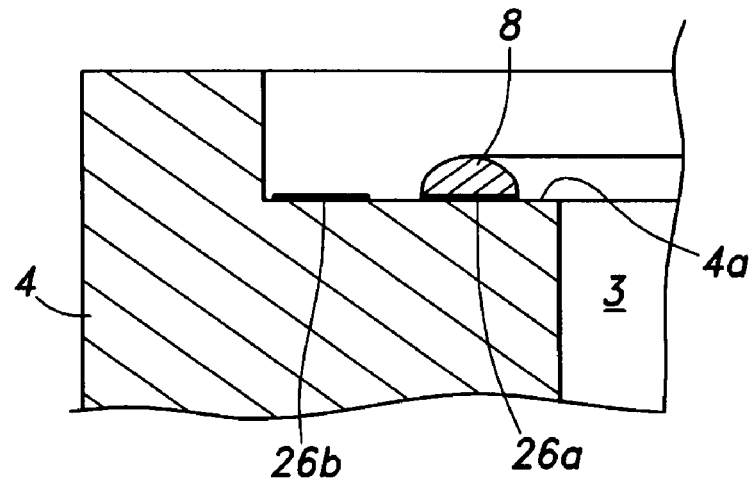
FIGS. 5*a* to 5*c* are views similar to FIG. 3 showing different steps of making the infrared detector package of a first modified embodiment of the present invention.
Figure 5B:
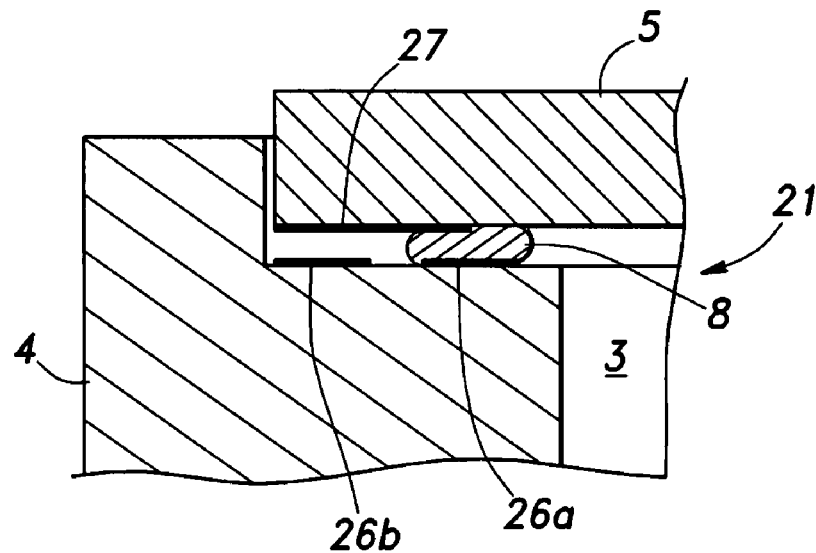
Figure 5C:
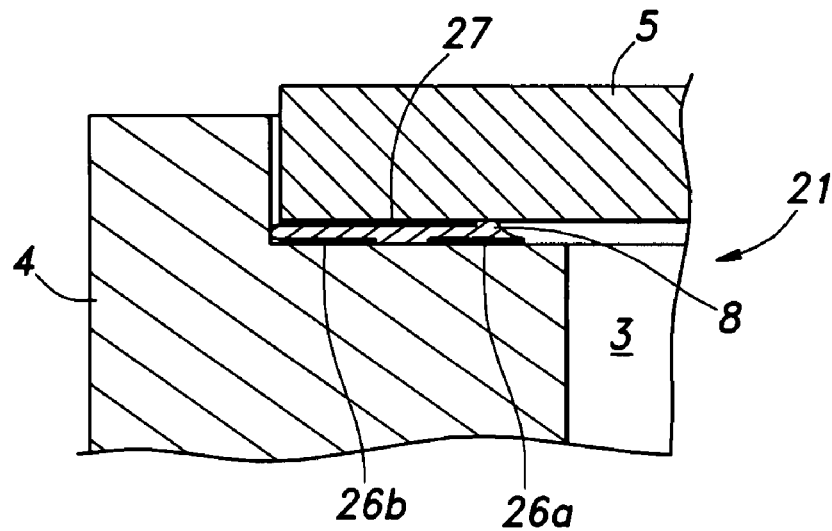

FIGS. 5a to 5c show a first modified embodiment of the present invention, and the parts corresponding to those of the previous embodiment are denoted with like numerals without repeating the description of such parts.

In the illustrated embodiment, a pair of mutually separated concentric annular metallized layers 26a and 26b are formed on the shoulder surface of the casing 4 in a similar manner as in the previous embodiment, but the brazing material is initially deposited on the inner annular metallized layer 26a on the shoulder surface 4a of the casing 4. A window annular metallized layer 27 of the window member 5 is provided on the opposing bonding surface thereof in a similar manner as in the previous embodiment, but the outer diameter of the window annular metallized layer 27 is substantially identical to that of the casing outer annular metallized layer 26b. The inner diameter of the window annular metallized layer 27 is intermediate between the inner and outer diameters of the casing inner annular metallized layer 26a. Therefore, in the plan view, the casing outer annular metallized layer 26b entirely overlaps with the window annular metallized layer 27 and the casing inner annular metallized layer 26a only partly overlaps with the window annular metallized layer 27.

This infrared detector package can be manufactured as described hereinafter.

As illustrated in FIG. 5a, a prescribed amount of molten brazing material 8 is deposited on the casing inner metallized layer 26a over the entire circumference thereof. Because of the lack of affinity between the molten brazing material 8 and ceramic material of the casing 4, the molten brazing material 8 essentially stays on the casing inner metallized layer 26a and bulges upward under the surface tension thereof. As discussed earlier, this step can be executed in an atmospheric environment.

The deposited brazing material 8 is allowed to solidify and the window member 5 is placed on the shoulder surface 4a of the casing 4 as illustrated in FIG. 5b. The assembly 21 is then placed in a vacuum chamber and is heated while the window member 5 is centered with respect to the casing 4 and pushed against the casing 4 by using a suitable jig and manipulator not shown in the drawings. As a result, the brazing material 8 partly liquefies and this breaks an oxidized surface skin of the brazing material so as to expose a new metal surface. Dross that forms on the molten surface of the brazing material remains relatively immobile because of its low fluidity while the molten metal relatively freely flows along the surface of the window metallized layer 27 until it reaches the outer edge of the casing outer metallized layer 6a because of a high fluidity of the molten brazing material 8 and a high affinity between the molten brazing material 8 and window annular metallized layer 27. In other words, guided by the window annular metallized layer 27, the molten brazing material 8 not only covers both the inner and outer window annular layers but also bridges across the two annular layers 26a and 26b. At the same time, the window annular metallized layer 27 is entirely covered by the brazing material 8 and joined to the casing annular layers 26a and 26b as illustrated in FIG. 5c.

Thereafter, the brazing material 8 is allowed to solidify in vacuum, and this causes the casing and window members to be not only joined securely together but also the cavity to be hermetically sealed off from the exterior. Thereby, the infrared detecting device 2 is placed in a vacuum environment formed in the cavity 3 of the casing 4.

In this embodiment, the casing inner annular metallized layer 26a performs the function of confining the initially deposited molten brazing material 8 within a prescribed area while the outer annular metallized layer 26b performs the function of bonding the ceramic casing 4 and window member 5 together.

Figure 6A:
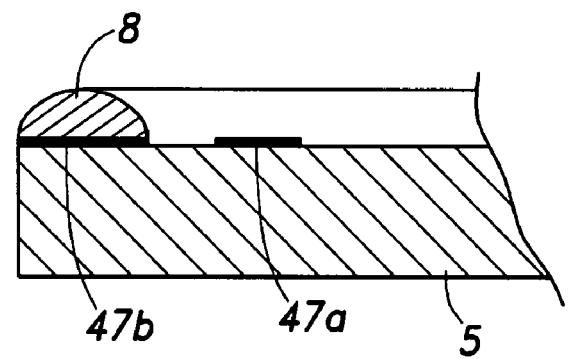
FIGS. 6*a* to 6*c* are views similar to FIG. 3 showing different steps of making the infrared detector package of a second modified embodiment of the present invention.
Figure 6B:
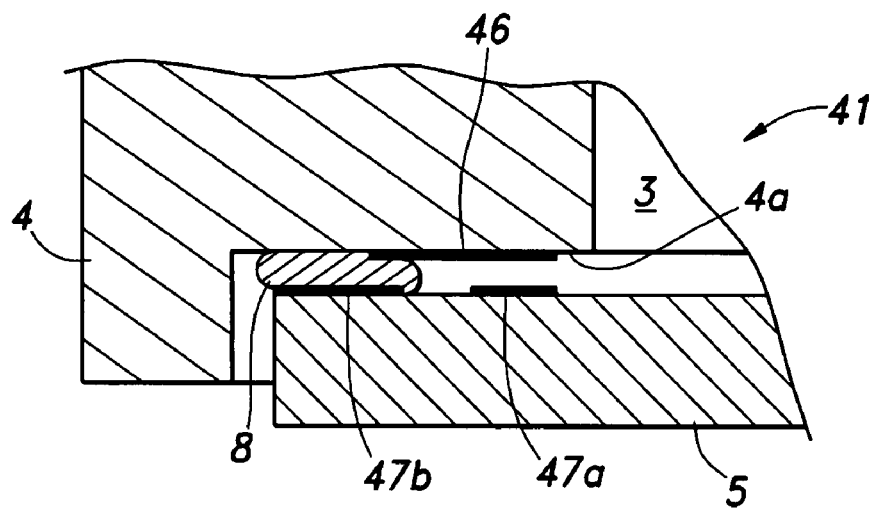
Figure 6C:
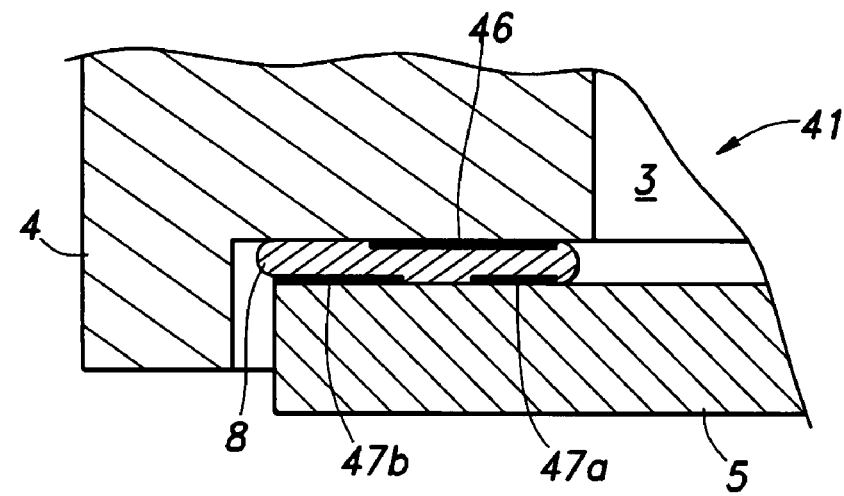

The brazing material was initially deposited on one of the concentric annular metallized layers on the side of the casing in the previous embodiments, but it is also possible to provide a pair of concentric annular metallized layers on the window member and initially deposit the brazing material on one of the concentric annular metallized layers on the side of the window member. Such an embodiment is illustrated in FIGS. 6a to 6c in which the parts corresponding to those of the previous embodiments are denoted with like numerals. Such parts are in part omitted in the following description.

First of all, a pair of mutually separated concentric annular metallized layers 47a and 47b are formed on the bonding surface provided on the outer periphery of the window member 5 as illustrated in FIG. 6a while a single annular metallized layer 46 is formed on the opposing shoulder surface 4a of the casing 4. Brazing material is then initially deposited on the outer metallized layer 47b on the bonding surface of the window member 5. The inner diameter of the casing annular metallized layer 46 is substantially identical to that of the window inner annular metallized layer 47a. The outer diameter of the casing annular metallized layer 46 is intermediate between the inner and outer diameters of the window outer annular metallized layer 47b. Therefore, in the plan view, the window inner annular metallized layer 47a entirely overlaps with the casing annular metallized layer 46 while the window inner annular metallized layer 47b only partly overlaps with the casing annular metallized layer 46.

This infrared detector package can be manufactured as described hereinafter.

As illustrated in FIG. 6a, a prescribed amount of molten brazing material 8 is deposited on the window outer metallized layer 47b over the entire circumference thereof. Because of the lack of affinity between the molten brazing material 8 and material of the window member 5, the molten brazing material 8 essentially stays on the window outer metallized layer 47b and bulges upward under the surface tension force thereof. As discussed earlier, this step can be executed in an atmospheric environment.

The deposited brazing material 8 is allowed to solidify and the window member 5 is placed on the shoulder surface 5a of the casing 4 as illustrated in FIG. 6b. The assembly is then placed in a vacuum chamber and is heated while the window member 5 is centered with respect to the casing 4 and pushed against the casing 4 by using a suitable jig and manipulator not shown in the drawings. As a result, the brazing material 8 partly liquefies and this breaks an oxidized surface skin of the brazing material so as to expose a new metal surface. Dross that forms on the molten surface of the brazing material remains relatively immobile because of its low fluidity while the molten metal relatively freely flows along the surface of the casing metallized layer 46 until it reaches the inner edge of the casing inner metallized layer 47a because of a high fluidity of the molten brazing material and a high affinity between the molten brazing material and casing annular metallized layer 46. In other words, guided by the casing annular metallized layer 46, the molten brazing material 8 not only covers both the inner and outer window annular layers 47a and 47b but also bridges across the two annular layers 47a and 47b. At the same time, the casing annular metallized layer 46 is entirely covered by the brazing material 8 and joined to the window annular layers 47a and 47b as illustrated in FIG. 6c.

Thereafter, the assembly is allowed to solidify in vacuum, and this causes the casing and window members to be not only joined securely together but also the cavity to be hermetically sealed off from the exterior. Thereby, the infrared detecting device is placed in a vacuum environment formed in the cavity 3 of the casing 4.

In this embodiment, the window outer annular metallized layer 47b performs the function of confining the initially deposited molten brazing material 8 within a prescribed area while the inner annular metallized layer 47a performs the function of bonding the ceramic casing 4 and window member 5 together.

Yet another modified embodiment is described in the following with reference to FIGS. 7a to 7c. The parts corresponding to those of the previous embodiments are denoted with like numerals, and such parts are partly omitted in the following description.

In the illustrated embodiment, the casing 64 is provided with a cavity 3, and is also provided with a shoulder surface which however includes an annular elevated portion 64a immediately surrounding the opening of the cavity 3 and a slightly lower top surface 64b of the casing 64 extending around the annular elevated portion 64a. The elevation of the annular elevated portion 64a with respect to the top surface 64b is approximately 0.5 mm in the illustrated embodiment, but, not exclusively, may be in the range of 0.1 mm to 5 mm. The surface of the annular elevated portion 64a is substantially in parallel with the top surface 64b.

An inner annular metallized layer 66a is formed on the upper face of the annular elevated portion 64a, and an outer annular metallized layer 66b is formed on the top surface 64b surrounding the annular elevated portion 64a in a concentric relationship. The opposing bonding surface of the window member 5 is provided with an annular metallized layer 67 along an entire outer peripheral part thereof.

The inner edge of the window annular metallized layer 67 substantially coincides with the inner edge of the casing inner annular metallized layer 66a while the outer edge of the window annular metallized layer 67 is intermediate between the inner and outer edges of the casing outer annular metallized layer 66b. In other words, the casing inner annular metallized layer 66a entirely overlaps with the window annular metallized layer 67 while the casing outer annular metallized layer only partly overlaps with the window annular metallized layer 67.

This infrared detector package can be manufactured as described hereinafter.

Figure 7A:
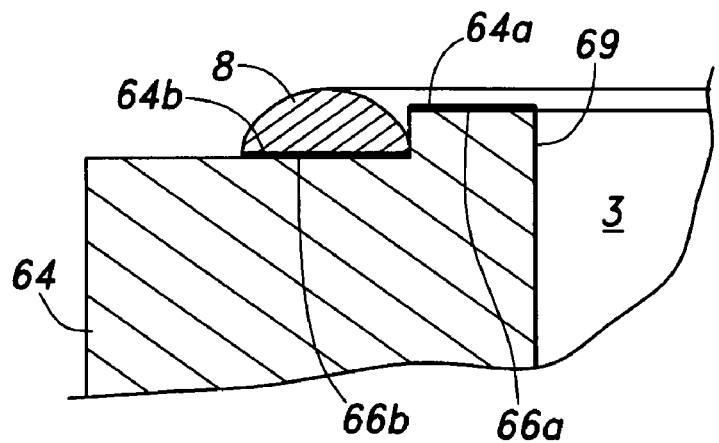
FIGS. 7*a* to 7*c* are views similar to FIG. 3 showing different steps of making the infrared detector package of a third modified embodiment of the present invention.

As illustrated in FIG. 7a, a prescribed amount of molten brazing material 8 is deposited on the casing outer metallized layer 66b over the entire circumference thereof. Because of the presence of a step between the annular elevated portion 64a and the remaining top surface 64b as well as the lack of affinity between the molten brazing material 8 and ceramic material of the casing 64, the molten brazing material 8 essentially stays on the casing outer metallized layer 66b and bulges upward under the surface tension thereof. As discussed earlier, this step can be executed in an atmospheric environment.

Figure 7B:
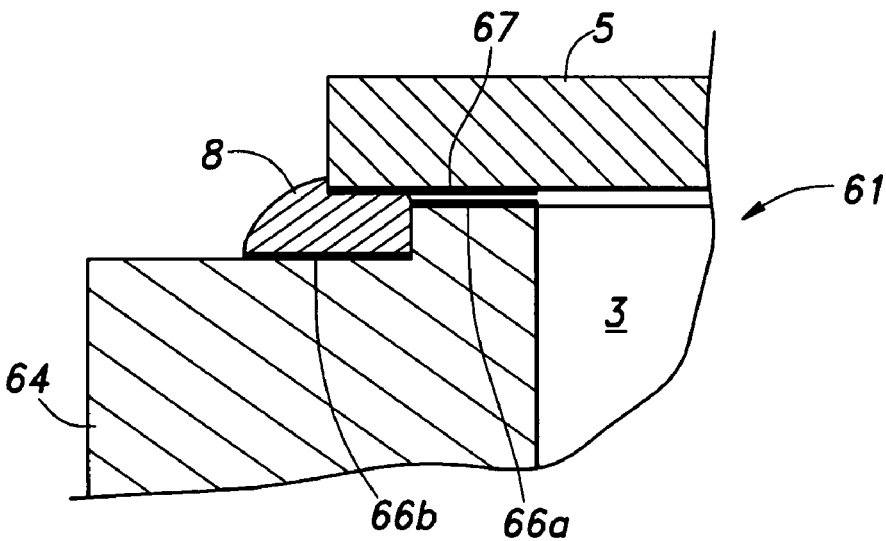
Figure 7C:
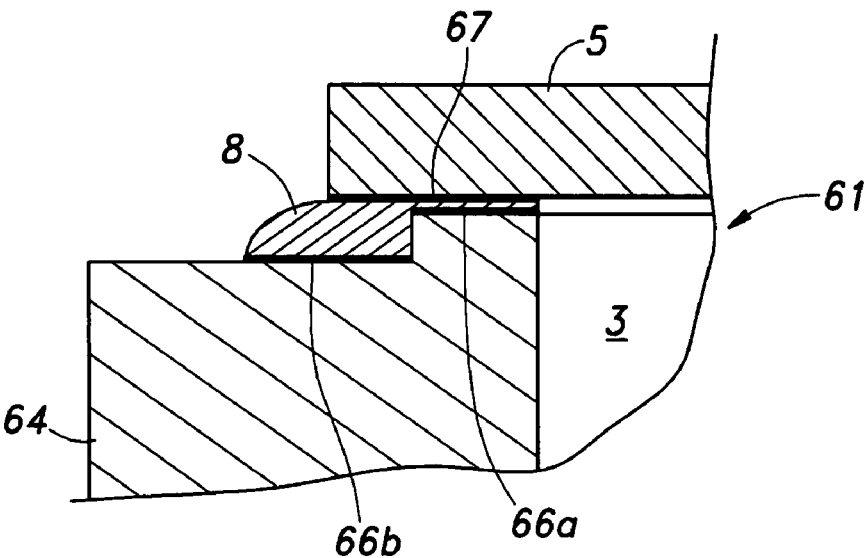

The deposited brazing material is allowed to solidify and the window member is placed on the elevated portion 64a of the casing 64 as illustrated in FIG. 7b. The assembly is then placed in a vacuum chamber and is heated while the window member 5 is centered with respect to the casing 64 and pushed against the casing 64 by using a suitable jig and manipulator not shown in the drawings. As a result, the brazing material 8 partly liquefies and this breaks an oxidized surface skin of the brazing material 8 so as to expose a new metal surface. Dross that forms on the molten surface of the brazing material 8 remains relatively immobile because of its low fluidity while the molten metal relatively freely flows along the surface of the window metallized layer 67 until it reaches the inner edge of the casing inner metallized layer 66a because of a high fluidity of the molten brazing material and a high affinity between the molten brazing material and window annular metallized layer 67. In other words, guided by the window annular metallized layer 67, the molten brazing material 8 not only covers both the inner and outer casing annular layers 66a and 66b but also bridges across the two annular layers 66a and 66b. At the same time, the window annular metallized layer 67 is entirely covered by the brazing material 8 and joined to the casing annular layers 66a and 66b as illustrated in FIG. 7c.

Thereafter, the assembly is allowed to solidify in vacuum, and this causes the casing and window members to be not only joined securely together but also the cavity 3 to be hermetically sealed off from the exterior. Thereby, the infrared detecting device is placed in a vacuum environment formed in the cavity 3 of the casing 64.

In this embodiment, the casing outer annular metallized layer 66b performs the function of confining the molten brazing material 8 within a prescribed area while the inner annular metallized layer 66a performs the function of bonding the ceramic casing 64 and window member 5 together.

Yet another modified embodiment is described in the following with reference to FIGS. 8a to 8c. The parts corresponding to those of the previous embodiments are denoted with like numerals, and such parts are partly omitted in the following description.

In the illustrated embodiment, the casing 84 is provided with a cavity 3, and is also provided with a shoulder surface 84a which is defined on an outer periphery of the opening of the cavity 3. In other words, the remaining part of the upper (as seen in FIGS. 8a to 8c) surface of the casing 84 defines an elevated surface 84b which is elevated in relation with the shoulder surface 84a. The elevation of the annular elevated surface 84b with respect to the annular shoulder surface 84a is approximately 0.5 mm in the illustrated embodiment, but, not exclusively, may be in the range of 0.1 mm to 5 mm. The annular elevated surface 84b is substantially in parallel with the annular shoulder surface 84a.

An inner annular metallized layer 86a is formed on the upper face of the annular shoulder surface 84a, and an outer annular metallized layer 86b is formed on the elevated surface 84b surrounding the annular shoulder surface 84a in a concentric relationship. The opposing bonding surface of the window member 5 is provided with an annular metallized layer 87 along an outer peripheral part thereof.

The outer edge of the window annular metallized layer 87 substantially coincides with the outer edge of the outer annular metallized layer 86b formed on the elevated surface 86b while the inner edge of the window annular metallized layer 87 is intermediate between the inner and outer edges of the casing inner annular metallized layer 86a formed on the annular shoulder surface 84a. In other words, the casing outer annular metallized layer 86b entirely overlaps with the window annular metallized layer 87 while the casing inner annular metallized layer 86a only partly overlaps with the window annular metallized layer 87.

This infrared detector package can be manufactured as described hereinafter.

Figure 8A:
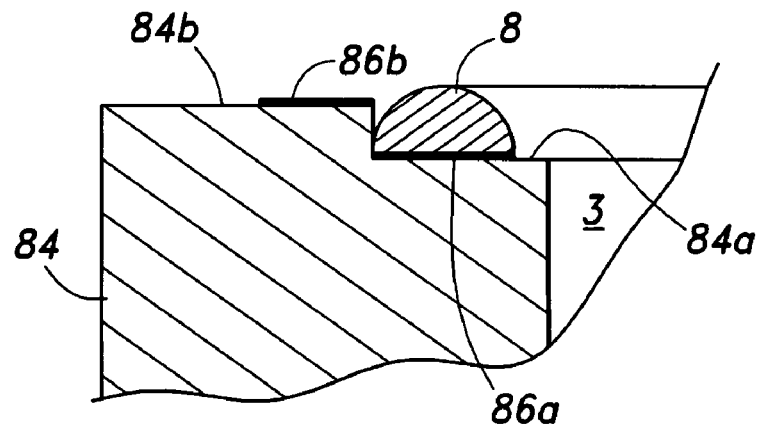
FIGS. 8*a* to 8*c* are views similar to FIG. 3 showing different steps of making the infrared detector package of a fourth modified embodiment of the present invention.
Figure 8B:
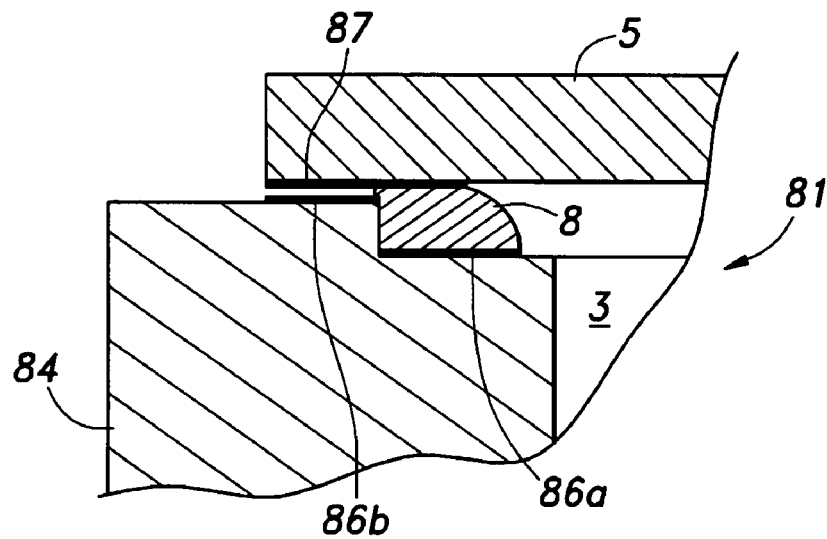
Figure 8C:
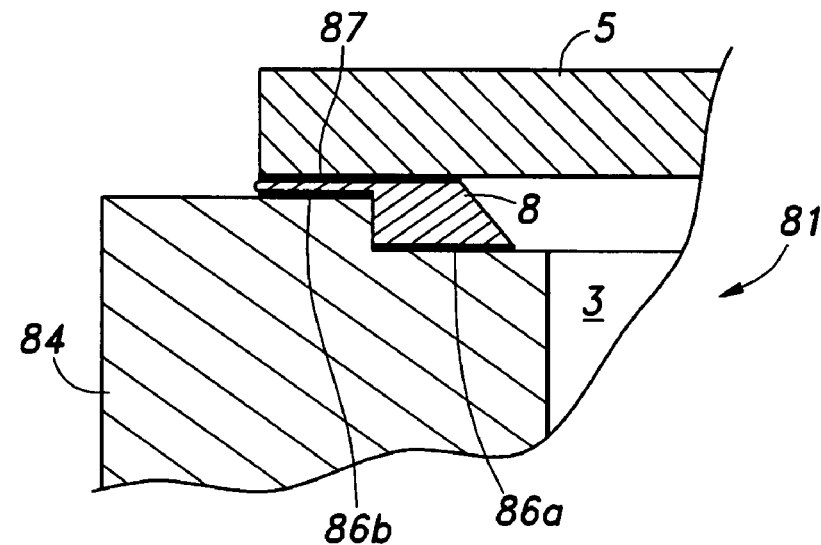

As illustrated in FIG. 8a, a prescribed amount of molten brazing material 8 is deposited on the casing inner metallized layer 86a over the entire circumference thereof. Because of the presence of a step between the annular shoulder surface 86a and the elevated surface 86b as well as the lack of affinity between the molten brazing material 8 and ceramic material of the casing 84, the molten brazing material 8 essentially stays on the casing inner metallized layer 86a and bulges upward under the surface tension thereof. As discussed earlier, this step can be executed in an atmospheric environment.

The deposited brazing material is allowed to solidify and the window member 5 is placed on the elevated surface 84b of the casing 84 as illustrated in FIG. 7b. The assembly is then placed in a vacuum chamber and is heated while the window member 5 is centered with respect to the casing 84 and pushed against the casing 84 by using a suitable jig and manipulator not shown in the drawings. As a result, the brazing material 8 partly liquefies and this breaks an oxidized surface skin of the brazing material 8 so as to expose a new metal surface. Dross that forms on the molten surface of the brazing material 8 remains relatively immobile because of its low fluidity while the molten metal relatively freely flows along the surface of the window metallized layer 87 until it reaches the inner edge of the casing inner metallized layer 86a because of a high fluidity of the molten brazing material and a high affinity between the molten brazing material and window annular metallized layer 87. In other words, guided by the window annular metallized layer 87, the molten brazing material 8 not only covers both the inner and outer casing annular layers 86a and 86b but also bridges across the two annular layers 86a and 86b. At the same time, the window annular metallized layer 87 is entirely covered by the brazing material 8 and joined to the casing annular layers 86a and 86b as illustrated in FIG. 8c.

Thereafter, the assembly is allowed to solidify in vacuum, and this causes the casing and window member to be not only joined securely together but also the cavity 3 to be hermetically sealed off from the exterior. Thereby, the infrared detecting device is placed in a vacuum environment formed in the cavity 3 of the casing 84.

In this embodiment, the casing inner annular metallized layer 86a performs the function of confining the molten brazing material 8 within a prescribed area while the outer annular metallized layer 86b performs the function of bonding the ceramic casing 84 and window member 5 together.

Although the present invention has been described in terms of preferred embodiments thereof, it is obvious to a person skilled in the art that various alterations and modifications are possible without departing from the scope of the present invention which is set forth in the appended claims. For instance, features illustrated or described as part of one embodiment may be used with another embodiment to yield still a further embodiment. It is intended that the invention includes these and other modifications and variations as coming within the scope and spirit of the invention.

For example, the casings of the foregoing embodiments were rectangular in shape while the inner cavity was cylindrical in shape, but the shapes of the casing and cavity may be freely selected from other possible shapes. The material of the casing is not limited to ceramic material, but may be selected from other suitable materials which, not exclusively, may include glass and metal such as stainless steel as long as it has a low affinity with the brazing material owing to the property of the material itself or the property of a surface coating that is applied to the surface of the casing. The window member was planar and a single piece member having a high infrared transmissivity in the foregoing embodiments, but may also be provided with other shapes and may consist of a plurality of pieces that include an infrared transmissive window portion. The infrared detecting device may also be incorporated with other components such as a Peltier device, getter and/or radiation shield.

Figure 9:
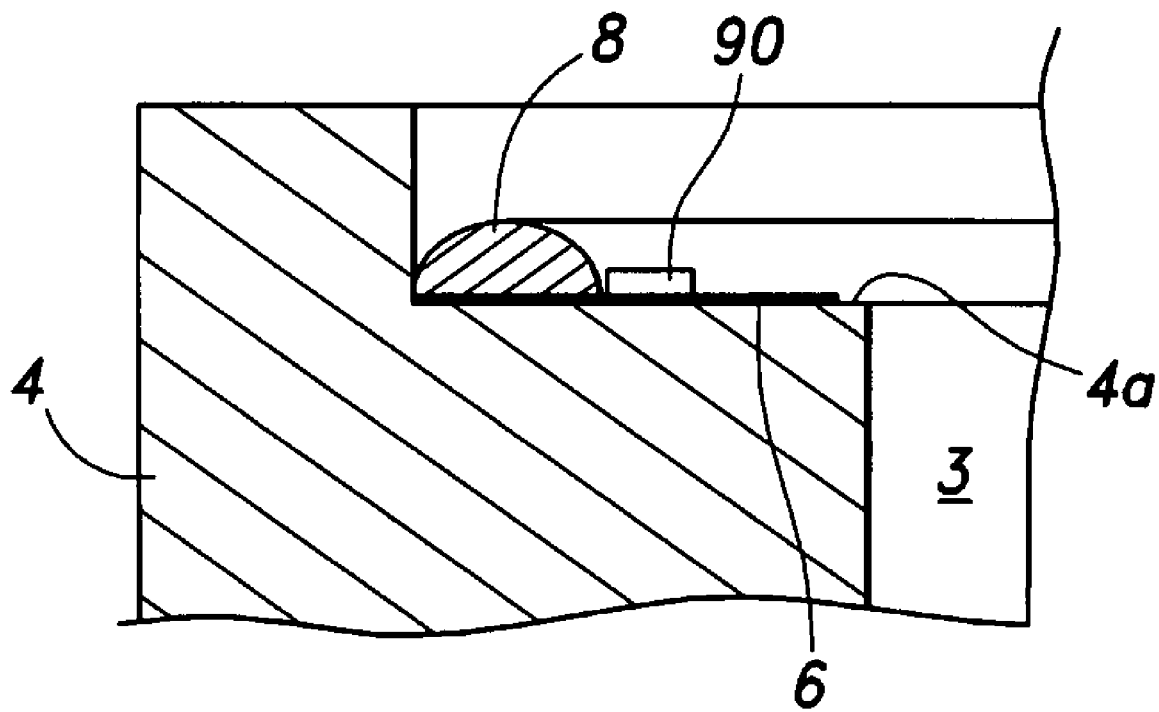
FIG. 9 is a view similar to FIG. 4*a* showing a fifth modified embodiment of the present invention.
Figure 10A:
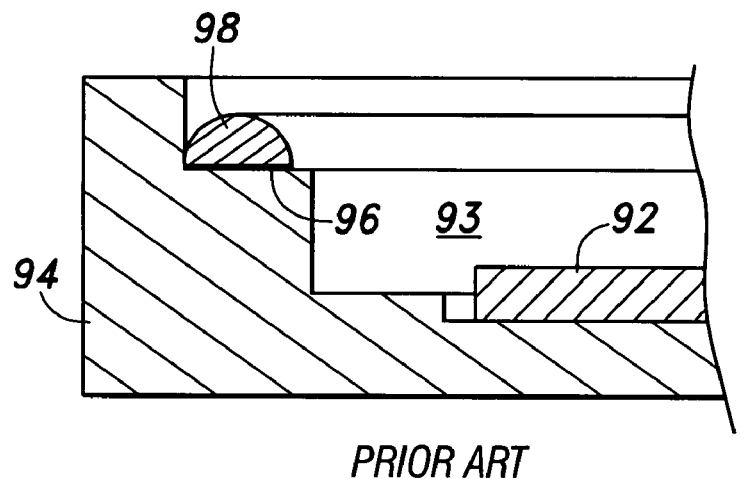
FIGS. 10*a* to 10*c* are views similar to FIG. 3 showing different steps of making the conventional infrared detector package.
Figure 10B:
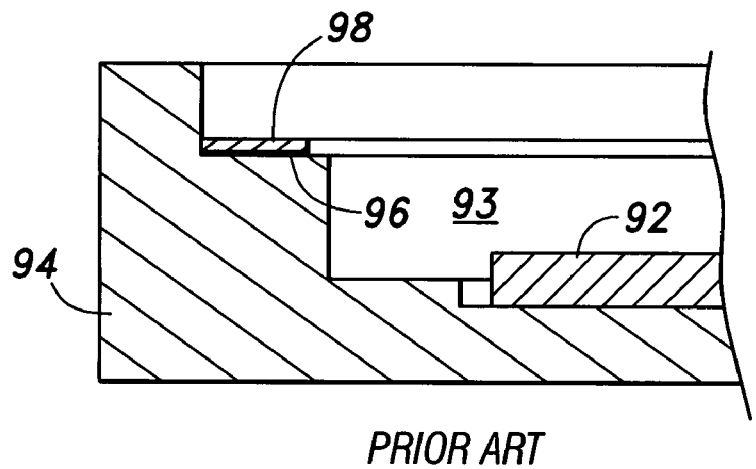
Figure 10C:
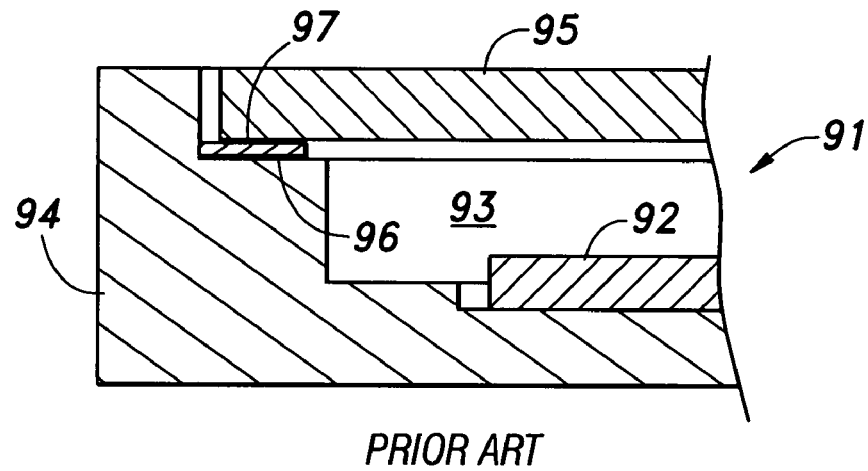

In the foregoing embodiments, the annular metallized layer of at least one of the window member and casing comprised a pair of mutually separated annular layers, but may also consists of a single annular layer if the annular metallized layer 6 is separated into two mutually concentric parts by an annular band 90 of material that has a low affinity with the brazing material and deposited on the annular metallized layer 6 as illustrated in FIG. 9. This annular band prevents the brazing material 8 initially deposited on one side of the annular band from flowing to the other side of the annular band until the assembly is subjected to a baking process in which the initially deposited brazing material 8 on the one side of the annular band 90 is heated and pressed until the brazing material flows along the opposing metallized layer and reaches the other side of the annular band 90. Therefore, the two concentric annular metallized layers as used herein shall include such a single annular metallized layer separated by such an annular band.

The contents of the original Japanese patent application on which the Paris Convention priority claim is made for the present application are incorporated in this application by reference.

The invention claimed is:

1. An infrared detector package, comprising:
a casing member defining a cavity therein and provided with an annular shoulder disposed around an opening of the cavity;
an infrared detector device received in the cavity;
a window member provided with an annular mating surface corresponding to the annular shoulder and having a high infrared transmissivity;
a first annular metallized layer formed along the annular shoulder of the casing member;
a second annular metallized layer formed along the annular mating surface of the window member; and
brazing material integrally interposed between the first and second metallized layers;
wherein one of the first and second annular metallized layers comprises a pair of mutually separated concentric portions while the other of the first and second annular metalized layers extends over a substantial part of each of the mutually separated concentric portions of the one annular layer, the brazing material extending across the pair of mutually separated concentric portions.

2. The infrared detector package according to claim 1, wherein the two mutually separated concentric portions are formed on mutually parallel portions of the corresponding mating surface that have different elevations.

3. The infrared detector package according to claim 1, wherein at least the part of the casing member or window member interposed between the mutually separated concentric portions is made of a material having a substantially low affinity with the brazing material as compared with material of the metallized layers.

4. The infrared detector package according to claim 1, wherein one of the mutually separated concentric portions substantially entirely overlaps with the opposing annular metallized layer while the other of the mutually separated concentric portions substantially only partly overlaps with the opposing annular metallized layer.

5. A method for making an infrared detector package, comprising the steps of:
preparing a casing member defining a cavity therein and provided with an annular shoulder disposed around an opening of the cavity;
mounting an infrared detector in the cavity;
preparing an window member provided with an annular mating surface corresponding to the annular shoulder and having a high infrared transmissivity;
forming a first annular metallized layer along the annular shoulder of the casing member;
forming a second annular metallized layer along the annular mating surface of the window member, at least one of the first and second annular metallized layers comprising a mutually separated concentric portions;
depositing molten brazing material on one of the mutually separated concentric portions and allowing the brazing material to solidify;
placing the window member and casing member into a vacuum environment;
heating the brazing material while pressing the window member against the casing member with the two members aligned with each other so as to coincide the first annular metallized layer with the second annular metallized layer;
allowing the brazing material to solidify in the vacuum environment; and
removing the completed infrared detector package out of the vacuum environment.

6. The method according to claim 5, wherein the two mutually separated concentric portions are formed on two mutually parallel portions of the corresponding mating surface that have different elevations.

7. The method according to claim 5, wherein at least the part of the casing member or window member interposed between the mutually separated concentric portions is made of a material having a substantially low affinity with the brazing material as compared with material of the metallized layers.

8. The method according to claim 5, wherein one of the mutually separated concentric portions substantially entirely overlaps with the opposing annular metallized layer while the other of the mutually separated concentric portions substantially only partly overlaps with the opposing annular metallized layer, and the molten brazing material is deposited on the other of the mutually separated concentric portions.

* * * * *